Feb. 22, 1966 J. M. COLLINGS ETAL 3,237,117

STABILIZED D.-C. AMPLIFIER

Filed Feb. 19, 1962 2 Sheets-Sheet 1

INVENTORS
Jerry M. Collings.
BY Delbert F. Waltrip.

Flehr and Swain.
ATTORNEYS.

Feb. 22, 1966 | J. M. COLLINGS ETAL | 3,237,117

STABILIZED D.-C. AMPLIFIER

Filed Feb. 19, 1962 | 2 Sheets-Sheet 2

INVENTORS
Jerry M. Collings.
BY Delbert F. Waltrip.

Flehr and Swain
ATTORNEYS.

United States Patent Office 3,237,117
Patented Feb. 22, 1966

3,237,117
STABILIZED D.-C. AMPLIFIER

Jerry M. Collings and Delbert F. Waltrip, Concord, Calif., assignors to Systron-Donner Corporation, Concord, Calif., a corporation of California Filed Feb. 19, 1962, Ser. No. 173,957
5 Claims. (Cl. 330—9)

This invention relates to a stabilized D.-C. amplifier and more particularly to a transistorized stabilized D.-C. amplifier.

There is a need for a stabilized D.-C. amplifier which has been transistorized to achieve small size, light weight and reliability and which still has the same characteristics for computing previously available with respect to conventional stabilized D.-C. amplifiers utilizing vacuum tubes.

In general, it is an object of the present invention to porvide a stabilized D.-C. amplifier which is transistorized.

Another object of the invention is to provide an amplifier of the above character which has a relatively high input impedance and a relatively wide bandwidth.

Another object of the invention is to provide an amplifier of the above character which is small in size and light in weight.

Another object of the invention is to provide an amplifier of the above character which has great reliability.

Another object of the invention is to provide an amplifier of the above character in which particularly novel feedback means are utilized to obtain a high input impedance.

Another object of the invention is to provide an amplifier of the above character in which particularly novel circuitry is utilized to minimize all high frequency components in the low frequency path in the amplifier.

Another object of the invention is to provide an amplifier of the above character in which a high input impedance is obtained in the amplifier in the low frequency path by utilizing a differential type input stage.

Another object of the invention is to provide an amplifier of the above character in which the amplifier in the low frequency path is D.-C. coupled.

Another object of the invention is to provide an amplifier of the above character in which D.-C. feedback means is provided to compensate for drift in the low frequency path.

Another object of the invention is to provide an amplifier of the above character in which frequency shaping networks are utilized to control stability.

Another object of the invention is to provide an amplifier of the above character in which a high voltage output range is obtainable.

Another object of the invention is to provide an amplifier of the above character which has a particularly novel output stage.

Additional objects and features of the invention will appear from the following description in which the preferred embodiments are set forth in detail in conjunction with the accompanying drawings.

Referring to the drawings.

In general, our stabilized D.-C. amplifier is utilized for amplifying an input signal having high and low frequency components. It consists of a high frequency path in which a capacitive resistive network is utilized to apply the high frequency components of the input signal to the amplifier. A chopper stabilized amplifier is utilized for applying the relatively low frequency components of the input signal to the high frequency path. The chopper stabilized amplifier is comprised of a chopper for modulating the low frequency components to provide an A.-C. signal, amplifier means for amplifying the A.-C. signal and a demodulator for demodulating the A.-C. signal, and means for supplying the demodulated signal to the high frequency path. The amplifier means consists of a differential amplifier and two cascaded amplifier stages which are D.-C. coupled and means for feeding back the output of the low key path to the differential amplifier to minimize the drift in the amplifier. The differential amplifier has a relatively high impedance.

Figure 1:
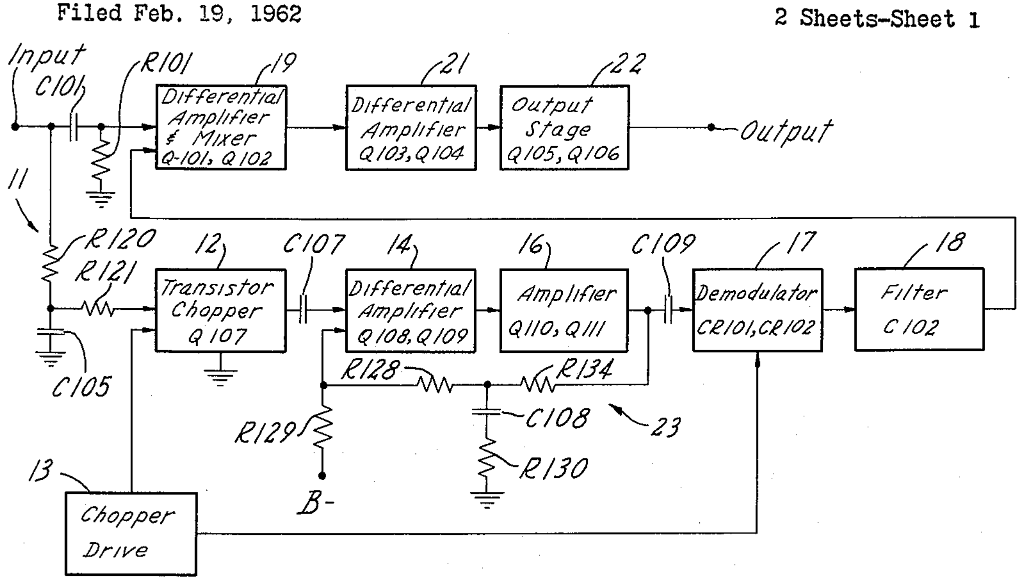
FIGURE 1 is a block diagram of a stabilized D.-C. amplifier incorporating our invention.

A block diagram of our stabilized D.-C. amplifier is shown in FIGURE 1. The input signal which is applied to the input can follow two signal paths, one through the capacitor C101, and the other through the resistor R120. The path to which the capacitor C101 is connected can be called the high frequency path, whereas the path to which resistor R120 is connected can be called the low frequency path. Also, the path in which the resistor R120 is located can be called the D.-C. signal path. Also, as hereinafter explained, a signal in the D.-C. path is carrier modulated to provide D.-C. drift stability.

The signal which follows the low frequency or D.-C. path first encounters a filter 11 which consists of the resistors R120, R121, and the capacitor C105. This filter is designed to eliminate any 400 cycle component which may be present in the signal applied to the input of the stabilized D.-C. amplifier, assuming that 400 cycles is utilized in the chopper drive. If this were not done, the chopper 12 would make a D.-C. term out of the 400 cycle component. The signal from the filter is then applied to a transistor chopper 12 which modulates the D.-C. component of the signal and serves to convert it to a 400 cycle A.-C. signal, assuming that the chopper drive 13 is operating at 400 cycles per second. The A.-C. signal from the transistor chopper 12 is coupled by a capacitor C107 into a differential amplifier 14 which is connected to an amplifier 16. The amplified carrier modulated signal from the amplifier 16 is then applied to a demodulator 17 through a coupling capacitor C109. As shown, the demodulator 17 is driven by the chopper 13 and serves to convert the carrier modulated signal to D.-C. The D.-C. drift occurring in stages 14 and 16 causes no error because of the blocking capacitor C109 which serves to block out any D.-C. Any carrier ripple remaining in the demodulated signal from the demodulator 17 is filtered out by the filter 18 and the D.-C. output from the filter 18 is supplied to a differential amplifier 19 which forms a part of the high frequency path connected to the capacitor C101. The differential amplifier 19, in addition to serving as amplifier, serves as a mixer to sum the signal components from the high frequency and low frequency paths. The sum of the two signals then passes through the cascaded differential amplifiers 19 and 21 and through an output amplification stage 22 to the output as shown in FIGURE 1.

To minimize drift in the low frequency path amplifiers 14 and 16, feedback means is provided consisting of resistors R128 and R134, and capacitor C108.

Figure 2:
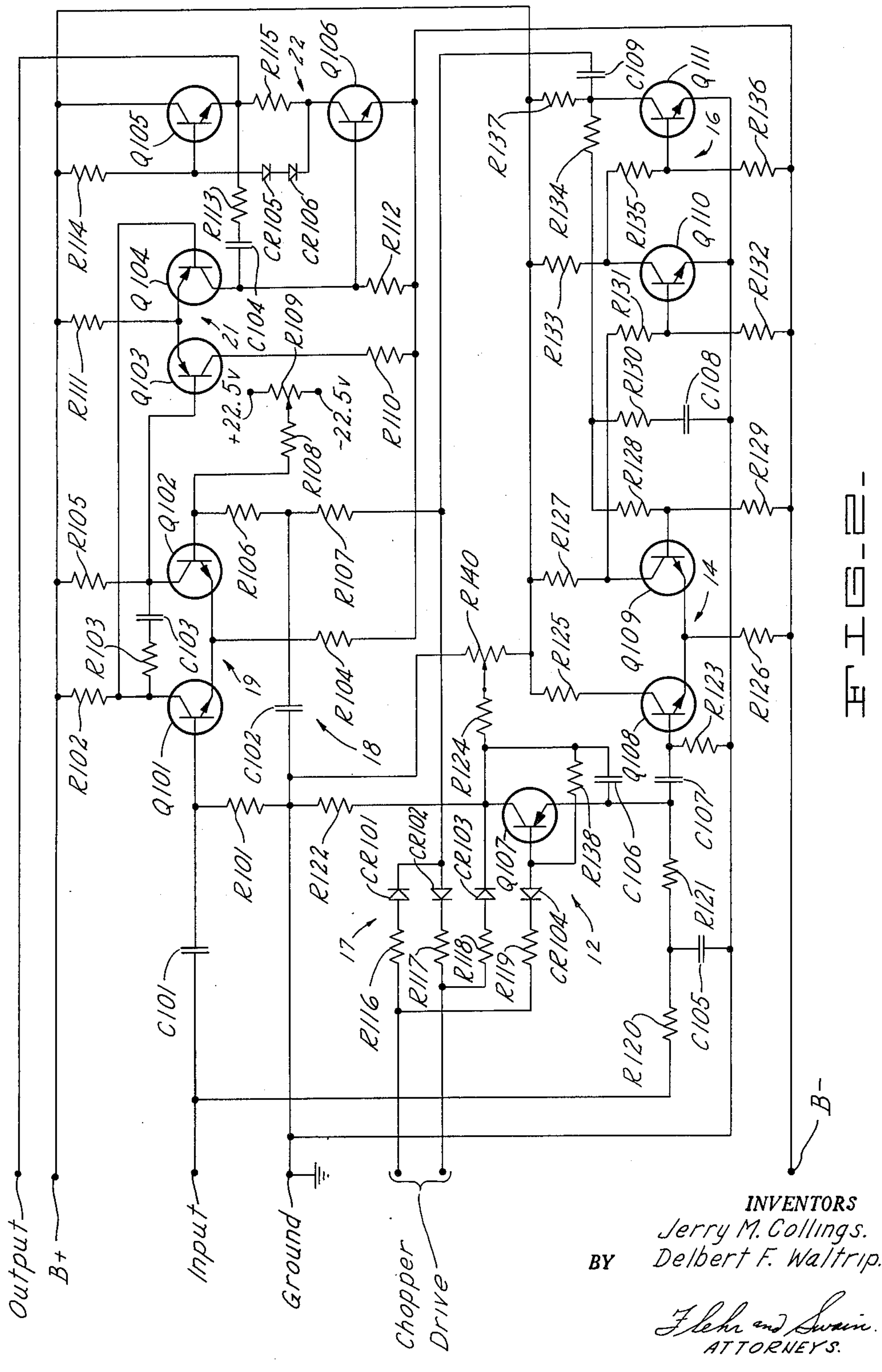
FIGURE 2 is a detailed circuit diagram of the major portion of the amplifier shown in FIGURE 1.

A detailed circuit diagram of the stabilized D.-C. amplifier as shown in block form in FIGURE 1 is shown in FIGURE 2. As will be noted from FIGURE 2, the transistors utilized therein have been designated by the letter Q with a certain number. The transistors associated with the blocks shown in FIGURE 1 are shown in the blocks to facilitate correlation between FIGURES 1 and 2.

As described in FIGURE 1, the low frequency components pass through to resistor R120 and through the filter 11 which consists of the resistors R120 and R121 and capacitor C105. This signal from the filter is applied to the transistor Q107 which forms a part of the transistor chopper 12. The transistor Q107 is turned on and off alternately by one side of a symmetrical 400 cycle drive supplied from the chopper drive 13. As can be seen, one side of the chopper drive is connected to the base of the transistor Q107 through the resistor R119 and the diode CR104. The other side of the chopper drive is connected to the collector of the transistor Q107 by a resistor R118 and a diode CR103. This is done to compensate for the 400 cycle component which exists due to the fact that the chopper is being turned on and off at a 400 cycle rate. The collector of the transistor Q107 is tied to ground through a resistor R122. A D.-C. bias current is supplied to this resistor R122 through resistor R124 connected to a potentiometer R140. The potentiometer is connected between B+ and ground as indicated. This D.-C. bias current is utilized to offset the collector to emitter voltage drop of transistor Q107 when the transistor Q107 is completely turned on.

The transistor Q107 is turned off and on by the chopper signal applied to its base. When the chopper drive signal is such that the transistor Q107 is turned on, no signal appears at the junction between R121 and capacitor C107. When the chopper transistor Q107 is turned off, the input signal appears at this junction between the resistor R121 and capacitor C107. Thus, it can be seen that the A.-C. component of the input signal appears at this junction between resistors R121 and C107 and is supplied through the blocking capacitor C107 to the differential amplifier 14 consisting of the transistors Q108 and Q109. The voltage which is to exist at the junction between R121 and C107 should be zero volts D.-C. and zero volts A.-C. when the input voltage is zero. The bias current flowing through the resistor R122 can be adjusted by the resistor R124 to reduce the voltage between R121 and C107 to zero.

In summary, it can be stated that both phases of the 400 cycle symmetrical chopper drive are applied to the base and collector, respectively, of the chopper transistor Q107. The transistor Q107 is used as a switch which is turned off and on very hard and thereby alternately shorts the junction between resistor R121 and capacitor 107 to ground. As is well known to those skilled in the art, a transistor used in this manner directly has several disadvantages. One is that it has a finite saturation voltage which tends to give an offset at this point and it also has some leakage current. To compensate for the saturation voltage which changes with temperature and leakage current which changes with temperature, several additions to the circuit are required. The first of these is that the collector of the transistor is tied to ground through the resistor R122. A D.-C. current is fed from the power supply connected to the resistor R124 through the resistor R122 to provide a voltage which is equal and opposite to that existing between the emitter and the collector of the chopper transistor and thus cancel the residual saturation voltage of the transistor chopper. Also, a 400 cycle signal which is exactly out of phase with the base drive is placed on the resistor R122 to cancel the effect of the leakage current which gets into the circuit when the transistor is in the off condition. The resistor R138 which is connected between the base and the collector of the transistor Q107 provides a leakage path which serves to provide the base current supply. A capacitor C106 is provided between the collector and the emitter of the transistor Q107 and is utilized to minimize the turn-off transients in the transistor which create spikes in the output of the A.-C. amplifier. Thus, it serves as a high frequency filter. The capacitor C106 also serves to minimize the 400 cycle residual current existing between the resistor R121 and the capacitor C107 when the input voltage is zero.

The diodes CR103 and CR104 give a high impedance in the cut-off direction between the 400 cycle chopper drive supply and the chopper circuitry.

If desired, it is possible to substitute the resistor R122 with a thermistor. In this way, it is possible to minimize any drift which may be due to temperature changes.

The resistors R120 and R121 have relativetly high values so that there is a high impedance driving the chopper. It is, therefore, desirable to provide a high input impedance looking into the input of the A.-C. amplifier 16. This is obtained by using a differential amplifier.

The differential amplifier 14 consists of transistors Q108 and Q109, whereas the two stage carrier modulated amplifier 16 consists of transistors Q110 and Q111. The entire amplifier following the blocking capacitor C107 is D.-C. coupled to simplify the circuitry and to minimize the number of components. Transistor Q108 is provided with a collector load resistor R125, and Q109 is provided with collector load resistor R127. The emitter resistor R126 for transistors Q108 and Q109 is connected to a suitable B− voltage supply such as a −22.5 volts. A resistor R123 is utilized to properly bias the transistor Q108. A voltage divider network consisting of resistors R128 and R129 connected to the base is provided to properly bias the transistor Q109. The resistor R129 is used to generate the proper operating level for the output of the transistor Q111. The base of the transistor Q110 is similarly biased by a voltage divider consisting of resistors R131 and R132. In the same manner, the base of the transistor Q111 is properly biased by the voltage divider network consisting of resistors R135 and R136. Collector load resistors R133 and R137 are provided for the transistors Q110 and Q111, respectively.

Because all the stages of the differential amplifier 14 and the two stage carried modulated amplifier 16 are D.-C. coupled, means is utilized to provide D.-C. feedback to stabilize the amplifiers so that the drift at the output will keep the transistors operating in the linear range. The feedback means is formed by serially connected resistors R134 and R128 connected between the collector of the transistor Q111 and the base of the transistor Q109. The resistors R134 and R128 have such a value that the proper D.-C. feedback is provided. In order not to reduce the 400 cycle gain of the amplifiers 14 and 16, a capacitor C108 in series with resistor R130 is tied between the junction of resistors R128 and R134 and ground. The capacitor C108 effectively eliminates practically all the 400 cycle feedback. The resistor R130 provides a small amount of feedback at 400 cycles in order to stabilize the amplifier under temperature.

From the foregoing, it can be seen that the use of the differential amplifier makes it possible to apply a D.-C. feedback to the amplifier to minimize drift and to keep the transistors in the amplifier operating in a linear range. The other two transistors Q110 and Q111 provide the desired gain in the carrier modulated signal which is supplied through the blocking capacitor C109 to the demodulator 17. The demodulator 17 consists of the diodes CR101 and CR102 with the serially connected resistors R116 and R117. The resistors R116 and R117 are connected to the chopper drive 13 as shown. This demodulator forms a switch driven by the chopper 13 which alternately changes the impedance at the junction between the resistor R107 and the diodes CR101 and CR102 from a certain value to ground. A D.-C. signal of the proper phase is produced which is coupled into the differential amplifier 19 through resistors R107 and R106. The 400 cycle A.-C. component of this signal is filtered to ground through the filter capacitor C102. This completes the D.-C. or low frequency path.

As hereinbefore explained, the high frequency portion of the input signal is coupled into the same differential amplifier 19. Thus, the high frequency portion of the input signal is supplied to the base of the transistor Q101, whereas the low frequency portion is supplied to the base of the transistor Q102. The transistors Q101 and Q102 are part of the differential amplifier 19 and operate in a conventional manner to mix and amplify the two signals. The resistors R102 and R105 are collector load resistors, whereas the resistors R104 supplies the proper emitter current. The resistor R101 provides the proper bias on the base of the transistor Q101. The proper bias for the base of the transistor Q102 is supplied through a resistor R108 and potentiometer R109 which has its ends connected to suitable voltages such as +22.5 volts and −22.5 volts as shown. The potentiometer R109 is utilized to set the output at zero when the input is zero.

A frequency shaping circuit is provided in the differential amplifier 19 and consists of a serially connected resistor R103 and capacitor C103 which are connected between the collectors of the transistors Q101 and Q102. This frequency shaping network serves to control the open loop frequency characteristics of the amplifier, both amplitude and phase, and this, in turn, tends to control the closed loop frequency response of the amplifier and prevent oscillations.

The differential amplifier 19 is cascaded with another differential amplifier 21 which includes transistors Q103 and Q104. Two cascaded differential amplifiers are utilized to minimize the D.-C. drift in this portion of the amplifier. Although the purpose of the low frequency path formed by the chopper stabilized amplifier is to compensate for this drift, the requirements are lessened on this path by minimizing the drift in the high frequency path. The emitter current for the two transistors Q103 and Q104 is supplied through the resistor R111. The collector load resistors are R110 and R112, respectively. The signal from the stage is removed through the resistor R112 and the collector of the transistor Q104 is connected to the base of a transistor Q106 which is the first transistor in the output stage 22.

The output stage is also in a cascade arrangement and consists of transistors Q106 and Q105. If the signal required at the output is negative, the current is supplied through the transistor Q106, whereas if the current required at the output is positive, the current is supplied by the transistor Q105.

A biasing network consisting of the two serially connected diodes CR105 and CR106 are connected between the base of the transistor Q105 and the collector of the transistor Q106 in parallel with a resistor R115 connected between the collector of the transistor Q106 and the emitter of the transistor Q105. The transistor Q106 is used for turning the transistor Q105 off and on as determined by transistor Q106 operating condition. The voltage across the resistor R112 is determined by the base-emitter drop of transistor Q106. As the current flow through resistor R112 changes, i.e., increases or decreases, more or less current will flow through resistor R115, through resistor R114, through the diodes CR105 and CR106 and through transistor Q106. As less driving current is furnished to transistor Q106, there is a tendency to cut-off transistor Q106 and thereby preventing current from flowing through diodes CR105 and CR106 and, in effect, forcing current into transistor Q105. This, in turn, turns on Q105 causing the output voltage to go positive. Thus, in this respect, transistor Q105 is actually acting as an emitter follower and transistor Q106 is acting as an emitter grounded amplifier stage. Thus, it can be seen that if the transistor Q106 is turned on fully, all the current will go through the diodes CR105 and CR106 and none of it will go into the base of the transistor Q105, whereas if Q106 is turned off, then Q105 will receive all the current and there will be no current flow through the diodes CR105 and CR106. It also can be seen that when transistor Q106 is being driven very hard, less current flows through the resistor R112 and the base-emitter drop in the transistor Q106 is at a minimum value. And, conversely, it can be seen that when transistor Q106 is not being driven very hard, a greater amount of current will flow through the resistor R112 because the base-emitter drop is at a maximum value. Also, it can be seen from the foregoing that the power supply voltage from plus to minus will appear across one of the transistors when the other transistor of the two transistors is fully conducting.

Another frequency shaping circuit is provided and consists of a series RC network comprised of a serially connected capacitor C104 and resistor R113 which are connected between the collector of the transistor Q104 and the emitter of the transistor Q105. This frequency shaping circuit operates in a manner similar to the frequency shaping circuit hereinbefore described to control the stability of the amplifier.

By way of example, one embodiment of our stabilized D.-C. amplifier had the following components and values.

| | |
|---|---|
| Transistors: | |
| Q101 | 2N335 |
| Q102 | 2N335 |
| Q103 | 2N1921 |
| Q104 | 2N1921 |
| Q105 | 2N335 |
| Q106 | 2N335 |
| Q107 | 2N1921 |
| Q108 | 2N335 |
| Q109 | 2N335 |
| Q110 | 2N335 |
| Q111 | 2N335 |
| Resistors: | |
| R101 | 130K |
| R102 | 150K |
| R103 | 1.5K |
| R104 | 100K |
| R105 | 150K |
| R106 | 68K |
| R107 | 68K |
| R108 | 1.0M |
| R109 | 1.0M |
| R110 | 2200Ω |
| R111 | 20K |
| R112 | 2200Ω |
| R113 | 5100Ω |
| R114 | 47K |
| R115 | 330Ω |
| R116 | 6200Ω |
| R117 | 6200Ω |
| R118 | 15K |
| R119 | 15K |
| R120 | 240K |
| R121 | 240K |
| R122 | 10Ω |
| R123 | 240K |
| R124 | 75K |
| R125 | 110K |
| R126 | 82K |
| R127 | 68K |
| R128 | 100K |
| R129 | 750K |
| R130 | 100Ω |
| R131 | 33K |
| R132 | 220K |
| R133 | 47K |
| R134 | 200K |
| R135 | 18K |
| R136 | 510K |
| R137 | 22K |
| R138 | 56K |
| R140 | 20K |
| Capacitors: | |
| C101 | 0.33$\mu$f. |
| C102 | ±100$\mu$f., 10 v. |
| C103 | .002$\mu$f. |
| C104 | 400 pf. |

Capacitors—Continued

| | |
|---|---|
| C105 | 0.02$\mu$f. |
| C106 | 150 pf. |
| C107 | 0.02$\mu$f. |
| C108 | 22$\mu$f., 25 v. |
| C109 | 0.33$\mu$f. |

Diodes:

| | |
|---|---|
| CR101 | 1N461 |
| CR102 | 1N461 |
| CR103 | 1N461 |
| CR104 | 1N461 |
| CR105 | 1N461 |
| CR106 | 1N461 |

Voltages:

| | |
|---|---|
| B+ | +22.5 v. |
| B− | −22.5 v. |

Although the transistors utilized in the above embodiment are of the silicon type, it is readily apparent that the circuit can be modified to utilize transistors of the germanium type.

Figure 3:
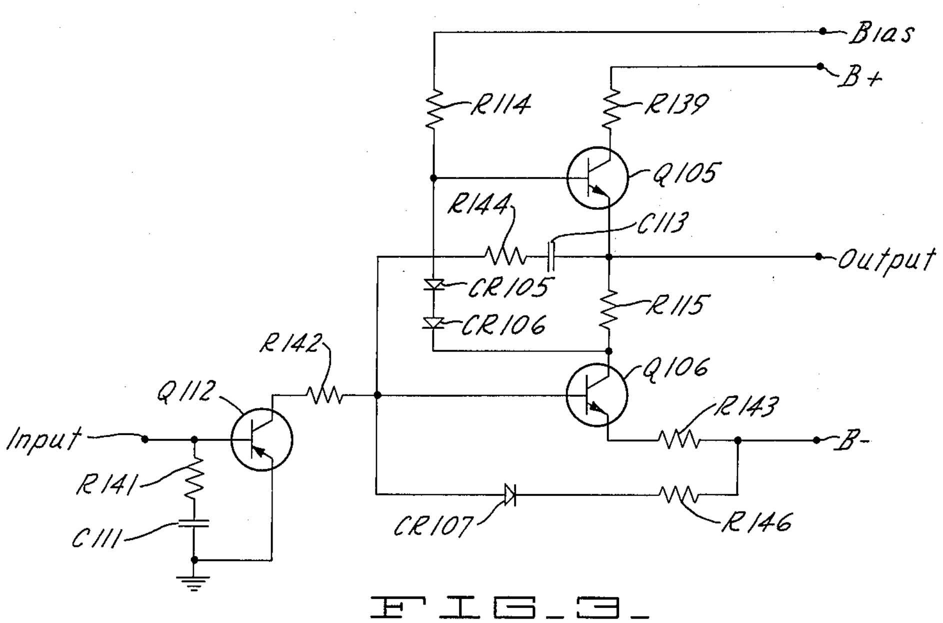
FIGURE 3 is a detailed circuit diagram of another output stage suitable for use in the circuitry shown in FIGURE 2 for providing an output of ±100 volts.

An alternative output stage providing a relatively high output voltage such as ±100 volts in place of the output stage disclosed in FIGURE 1 is shown in FIGURE 3. Upon viewing the circuitry shown in FIGURE 3, it can be seen that it is very similar to that shown in FIGURE 1 with the exception that a transistor Q112, a diode CR107 and resistors R143 and R146 have been provided. Transistor Q112 is part of a grounded-emitter stage which receives its input from the collector of the transistor Q104. A serially connected resistor R141 and capacitor C111 are connected between the base and emitter of the transistor Q112 and serve as a frequency stabilizing network. A collector load resistor R142 is provided for transistor Q112 which is connected to the base of the transistor Q106.

The transistor Q112 absorbs a portion of the voltage drop acros the previous stage to the negative power supply required for the operation of the transistor Q106. As shown, the B− or negative supply can be any suitable voltage such as −105 volts. The transistor Q112 will absorb a voltage drop of 75 to 90% e.g., 75 to 90 volts depending upon the current to it since the resistors R142 and R146 are in series. The diode CR107 is provided in series between the resistors R142 and R146 and serves to absorb a part of the voltage drop. This makes it possible to use a resistor having a relatively low value for the resistor R146. Because of the smaller resistance, the transistor Q106 will see a low impedance and, therefore, will be able to withstand the voltage spread between B+ and B− (210 volts) when it is in the turned off condition.

The resistor R139 acts as a current limiting resistor. It serves to absorb some of the wattage that need to be dissipated at the lower voltage, higher current levels. This resistor R139 makes it possible for the transistor Q105 to operate within a lower wattage range. Resistors R115 and R114 and the two diodes CR105 and CR106 operate in the same manner as in the embodiment shown in FIGURE 1. The first diode CR105 normally has the same drop as the base-emitter drop of the transistor Q105. The drop across the resistor R115 should equal the drop across the second diode when the amplifier has an output of zero volts. Thus, the resistor R115 essentially sets the quiescent current which flows. This quiescent current flows through resistor R139, transistor Q105, resistor R115, transistor Q106 and resistor R143. This quiescent current is sufficient to keep the transistor Q105 in a semi-cutoff condition so that the voltage drop across it is equal to B+.

By way of example, one embodiment of the output stage shown in FIGURE 3 had the following components and values:

Transistors:

| | |
|---|---|
| Q112 | Sperry semiconductor **20652** |
| Q105 and Q106 | Rheem type RT5394A |

Diodes:

| | |
|---|---|
| CR105, CR106 and CR107 | Type 1N461 |

Resistors:

| | | |
|---|---|---|
| R114 | K | 100 |
| R139 | ohms | 330 |
| R143 | do | 110 |
| R144 | K | 10 |
| R145 | ohms | 110 |
| R146 | K | 1 |
| R141 | K | 51 |
| R142 | K | 7.5 |

Capacitors:

| | | |
|---|---|---|
| C111 | pf | 500 |
| C113 | pf | 500 |

Voltages:

| | | |
|---|---|---|
| Bias | volts | +150 |
| B+ | do | +105 |
| B− | do | −105 |

Although the stabilized D.-C. amplifiers which we have hereinbefore described are often called operational amplifiers, it is readily apparent to those skilled in the art that by the utilization of external passive networks, other types of devices can be formed. For example, by the addition of passive networks and an integrator, a summer or an inverter can be readily formed merely by the use of complex passive networks utilizing the amplifier. Also, filters with precisely known characteristics can be designed utilizing this same operational amplifier.

We claim:

1. In an operational amplifier for amplifying an input signal having high and low frequency components, an input terminal, a wide band D.-C. amplifier having first and second inputs, means connecting the input terminal to the first input of the wide band D.-C. amplifier and serving to essentially block out the D.-C. signal whereby the relatively high frequency components of the input signal are applied to the first input of the wide band D.-C. amplifier, chopper amplifier means connected to the input terminal and to the second input of the wide band D.-C. amplifier for applying the relatively low frequency components of the input signal to the wide band D.-C. amplifier, said chopper amplifier means comprising a chopper having an input and a output, a filter connected to the input terminal and to the input of the chopper for filtering out the high frequency components of the input signal, said chopper serving to modulate the low frequency components to provide a carrier modulated signal, carrier amplifier means having an output and including a differential amplifier input stage having first and second inputs, means connecting the output of the chopper to the first input of the differential amplifier stage and serving to couple the carrier modulated signal to the carrier amplifier means whereby the same may be amplified and also serving to prevent feedback of erroneous essentially D.-C. signals to the chopper, demodulating means having an input and an output, and means coupling the output of the carrier amplifier means to the input of the demodulating means and serving to decouple the carrier amplifier from the demodulating means and to pass the signal from the carrier amplifier means to the demodulating means without interfering with the D.-C. output level of the carrier amplifier means, said demodulating means serving to demodulate the amplified carrier modulated signal, and means connecting the output of the demodulating means to the second input of said wide band D.-C. amplifier, said carrier amplifier means having means for feeding back a portion of the output of the carrier amplifier means to the second input of the differential amplifier input stage of the carrier amplifier means to raise the input impedance of the carrier amplifier means, to increase the gain stability of the chopper amplifier means and to maintain the carrier amplifier means stable irrespective of temperature changes.

2. An operational amplifier as in claim 1 wherein said wide band D.-C. amplifier includes a differential amplifier input stage and an output stage, said differential amplifier of the wide band D.-C. amplifier having first and second inputs and an output, said first and second inputs of the differential amplifier of the wide band D.-C. amplifier corresponding to the first and second inputs to the wide band D.-C. amplifier, said output stage having an input and an output, means connecting the output of the differential amplifier input stage of the wide band D.-C. amplifier to the input of the output stage, said output stage comprising first and second transistors, each having emitter, base and collector elements, a bias power supply, diode means connected to the bias power supply and to the base of the first transistor and to the collector of the second transistor, resistor means connecting the emitter of the first transistor to the collector of the second transistor, a positive power supply, means connecting the collector of the first transistor to the positive power supply, a negative power supply, means connecting the emitter of the second transistor to the negative power supply, means connecting the base of the second transistor to the input to the output stage, and a frequency stabilizing network connected between the emitter of the first transistor and the base of the second transistor.

3. An operational amplifier as in claim 1 together with a common reference potential and wherein said means for feeding back a portion of the output of the carrier amplifier means to the second input of the differential amplifier input stage includes series resistor means connected between the output of the carrier amplifier means and the second input of the differential amplifier input stage of the carrier amplifier means to provide a negative feedback for all frequencies, a negative power supply, means connecting the negative power supply to the second input of the differential amplifier input stage of the carrier amplifier means, and shunt capacitor means connected to said series resistor means and to said common reference potential to form a shunt path for certain frequencies.

4. In an operational amplifier for amplifying an input signal having high and low frequency components, an input terminal, a wide band D.C. amplifier having first and second inputs, a common ground reference, means connecting the input terminal to the first input of the wide band D.C. amplifier and to the common ground reference and serving to essentially block out the D.C. signal whereby the relatively high frequency components of the input signal are applied to the first input of the wide band D.C. amplifier, chopper amplifier means having an input connected to the input terminal and having an output connected to the second input of the wide band D.C. amplifier for applying the relatively low frequency components of the input signal to the wide band D.C. amplifier, said chopper amplifier means comprising a chopper having an input and an output, filter means connected to the input terminal, to the common ground reference and to the input of the chopper for filtering out the high frequency components of the input signal, said chopper serving to modulate the low frequency components to provide a carrier modulated signal, carrier amplifier means including a differential amplifier input stage having first and second inputs and an output, means connecting the output of the chopper to the first input of the differential amplifier input stage of the chopper amplifier means and serving to couple the carrier modulated signal to the carrier amplifier means whereby the same may be amplified and also serve to prevent feedback of erroneous essntially D.C. signals to the chopper, series resistor means connecting the output of the carrier amplifier means to the second input of the differential amplifier input stage, shunt capacitance means connecting the series resistor means to the common ground reference, a negative power supply, means connecting the negative power supply to the second input of the differential amplifier input stage, demodulating means having an input and an output, means coupling the output of the differential amplifier input stage to the input of the demodulating means and serving to decouple the differential amplifier input stage from the demodulating means and to pass the signal from the differential amplifier input stage to the demodulating means without interfering with the D.C. output level of the differential amplifier input stage, said demodulating means serving to demodulate the amplified carrier modulated signal, and means connecting the output of the demodulating means to the second input of said wide band D.C. amplifier.

5. An operational amplifier as in claim 4 wherein said wide band D.C. amplifier includes a differential amplifier input stage and an output stage, said differential amplifier input stage having first and second inputs and an output, said first and second inputs of the differential amplifier input stage of the wide band D.C. amplifier corresponding to the first and second inputs to the wide band D.C. amplifier, said output stage having an input and an output, means connecting the output of the differential amplifier input stage of the wide band D.C. amplifier to the input of the output stage, first and second transistors, each having emitter, base and collector elements, a bias power supply, a pair of serially connected diodes connected to the bias power supply and to the base of the first transistor and to the collector of the second transistor, resistor means connecting the emitter of the first transistor to the collector of the second transistor, a positive power supply, means connecting the collector of the first transistor to the positive power supply, a negative power supply, means connecting the emitter of the second transistor to the negative power supply, means connecting the base of the second transistor to the input to the output stage, and a frequency stabilizing network connected between the emitter of the first transistor and the base of the second transistor.

References Cited by the Examiner

UNITED STATES PATENTS

| | | | |
|---|---|---|---|
| 2,619,552 | 11/1952 | Kerns | 330—9 |
| 2,730,573 | 1/1956 | Sedgfield et al. | 330—9 X |
| 2,801,296 | 7/1957 | Blecher | 330—9 |
| 2,935,693 | 5/1960 | Landsberg | 330—9 |
| 3,081,435 | 3/1963 | Miller | 330—9 |

ROY LAKE, *Primary Examiner.*

NATHAN KAUFMAN, *Examiner.*